United States Patent [19]

Jeyarajan et al.

[11] Patent Number: 4,940,073
[45] Date of Patent: Jul. 10, 1990

[54] MOLD FOR CASTING A SINGLE CRYSTAL METAL ARTICLE

[75] Inventors: Arunachalam Jeyarajan, Euclid; Lawrence D. Graham, Chagrin Falls; John E. Brokloff, North Canton; Louis H. Monte, Minerva, all of Ohio

[73] Assignee: PCC Airfoils, Inc., Cleveland, Ohio

[21] Appl. No.: 382,729

[22] Filed: Jul. 19, 1989

[51] Int. Cl.⁵ .............................................. B22C 9/04
[52] U.S. Cl. ................................. 164/361; 164/122.2
[58] Field of Search .................... 164/122.2, 122.1, 361

[56] References Cited

U.S. PATENT DOCUMENTS 3,542,120 11/1970 Piearcey .
4,180,119 12/1979 Burd et al. .
4,475,582 10/1984 Giamei et al. .
4,548,255 10/1985 Reiner et al. .

FOREIGN PATENT DOCUMENTS 761050 11/1956 United Kingdom .

*Primary Examiner*—Kuang Y. Lin
*Attorney, Agent, or Firm*—Tarolli, Sundheim & Covell

[57] ABSTRACT

A single crystal selector has a passage into which a plurality of crystals grow from a starter cavity and from which a single crystal emerges into an article mold cavity. The single crystal selector passage includes a linear lower vertical portion which extends upwardly away from an end portion on the starter cavity. A linear vertical upper portion of the selector passage extends downwardly from a lower end portion of the article mold cavity. A single bend portion of the selector passage extends between the upper and lower portions of the selector passage. A support element extends upwardly from a lower section of the selector to an upper section of the selector to at least partially support a single bend section of the selector. The single bend portion of the selector passage has a generally circular cross sectional configuration with a diameter which is less than 0.25 inches. The single bend portion of the selector passage extends sidewardly for a distance which is at least 1.5 times the diameter of the selector passage.

11 Claims, 3 Drawing Sheets

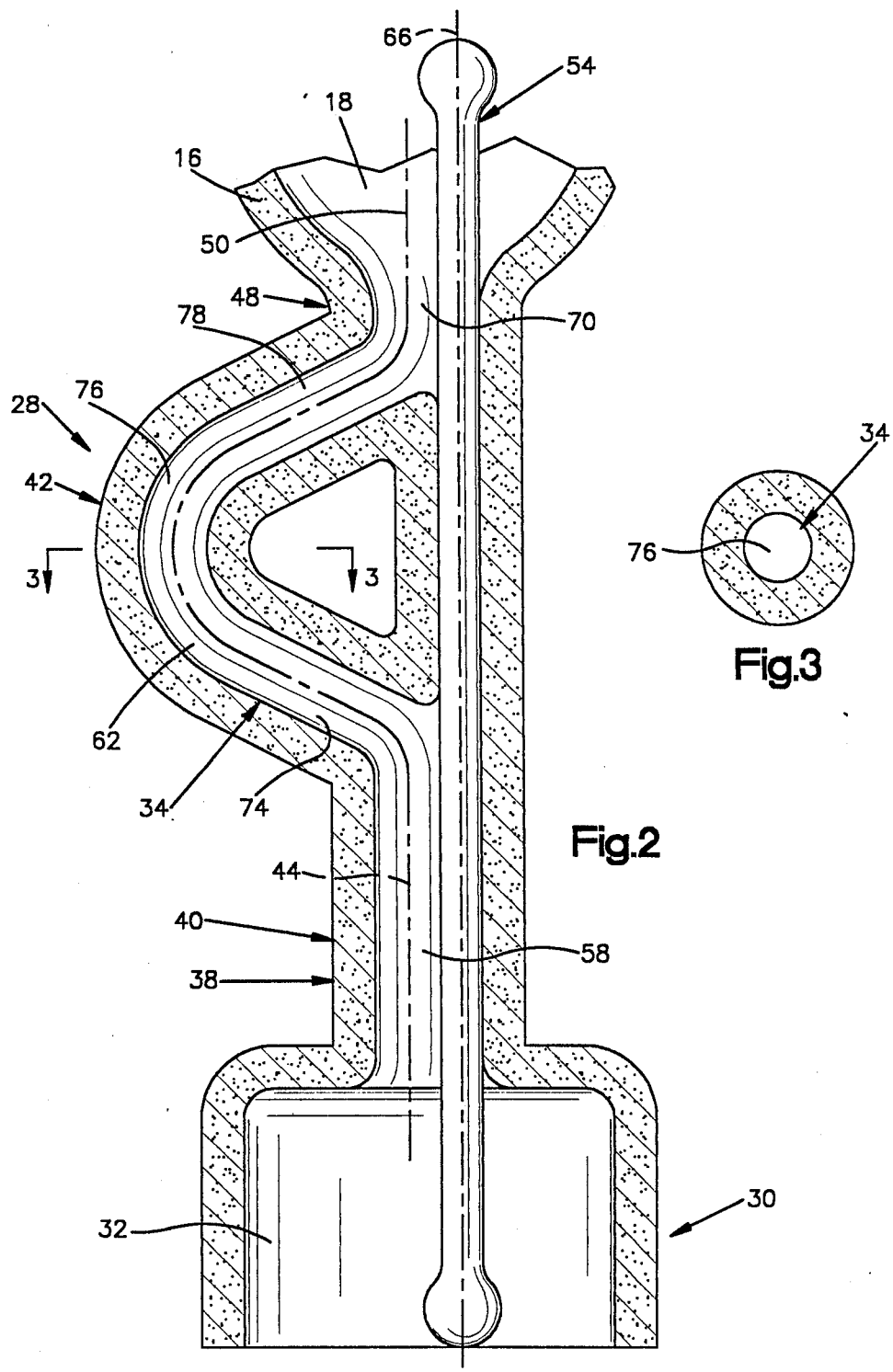

MOLD FOR CASTING A SINGLE CRYSTAL METAL ARTICLE

BACKGROUND OF THE INVENTION

The present invention relates to a mold which is used to cast a metal article as a single crystal.

Molds for casting single crystal metal articles have previously utilized helical crystal selectors of the so-called "pigtail" type. The casting of single crystal articles utilizing a helical selector is relatively expensive. This expense may be contributed to by a substantial scrap rate. The relatively high scrap rate is, in part at least, due to more than one crystal emerging from the crystal selector into the article mold cavity.

The molds for forming single crystal articles are commonly made by an investment or lost wax process. In this process of making a mold, a wax pattern is first formed. The wax pattern is covered with a layer of ceramic mold material. The wax pattern is removed from the layer of ceramic mold material to leave a space having a configuration corresponding to the configuration of the wax pattern.

The forming of a wax pattern with a helical selector requires relatively complicated tooling or injection molds in which the wax pattern of the helical selector is formed. Single crystal molds having a helical selector are disclosed in U.S. Pat. Nos. 4,475,582 and 4,548,255. A helical selector having a central support element is disclosed in U.S. Pat. No. 4,180,119.

SUMMARY OF THE INVENTION

A mold constructed in accordance with the present invention is used to cast a single crystal metal article. The mold has an improved crystal selector which promotes the emergence of a single crystal from the selector into an article mold cavity. The selector has a relatively simple construction which tends to minimize tooling costs. In addition, the simple construction of the single crystal selector of the present invention minimizes the amount of relatively expensive metal which is used in the selector.

The single crystal selector of the present invention has a selector passageway with a linear lower vertical portion which extends upwardly from a starter cavity. The selector passage also has a linear vertical upper portion which extends downwardly from the article mold cavity. A single bend portion of the selector passage extends between an upper end of the lower portion of the selector passage and a lower end of an upper portion of the selector passage.

The single bend portion of the selector passage has only a single arcuate bend with a curving longitudinal central axis which is disposed in the same plane as coincident vertical axes of the upper and lower portions of the selector passage. The single arcuate bend portion of the selector passage has a diameter which is less than 0.25 inches. The bend portion of the selector passage extends sidewardly from the vertical axes of the upper and lower portions of the selector passage by a distance which is at least 1.5 times the diameter of the single bend portion of the selector passage.

Due to its configuration, the single bend portion of a single crystal selector constructed in accordance with the present invention may have difficulty in withstanding vertical and/or sideward loads applied to a wax pattern of the selector passage and/or ceramic mold material forming the selector. Therefore, a support element may be provided between opposite ends of the single bend portion of the selector to strengthen the selector. The support element enables the selector to withstand relatively large vertical and/or sideward loads. However, if the wax pattern of the selector and the selector itself have sufficient strength, the support element may be omitted.

Accordingly, it is an object of this invention to provide a new and improved mold for use in casting a single crystal metal article and wherein a single crystal selector passage has vertically extending upper and lower portions which are interconnected by a single bend portion which projects sidewardly from the vertically extending upper and lower portions of the passage.

Another object of this invention is to provide a new and improved mold as set forth in the preceding object and wherein a support element extends upwardly from a lower section of the selector to an upper section of the selector to at least partially support a single bend section of the selector.

Another object of this invention is to provide a new and improved mold in accordance with either one of the preceding objects and wherein the single bend portion of the selector passage has a circular cross section with a diameter which is less than 0.25 inches and wherein the single bend portion extends sidewardly from the upper and lower portions of the selector passage by a distance which is at least 1.5 times the diameter of the single bend portion of the selector passage.

BRIEF DESCRIPTION OF THE DRAWINGS

The foregoing and other objects and features of the present invention will become more apparent upon a consideration of the following description taken in connection with the accompanying drawings, wherein:

FIG. 2 is an enlarged sectional view of a single crystal selector used in the mold of FIG. 1;

FIG. 3 is a sectional view, taken generally along the line 3—3 of FIG. 2, illustrating the cross sectional configuration of a bend portion of a passage in the single crystal selector.

DESCRIPTION OF SPECIFIC PREFERRED EMBODIMENTS OF THE INVENTION

Mold Structure

Figure 1:
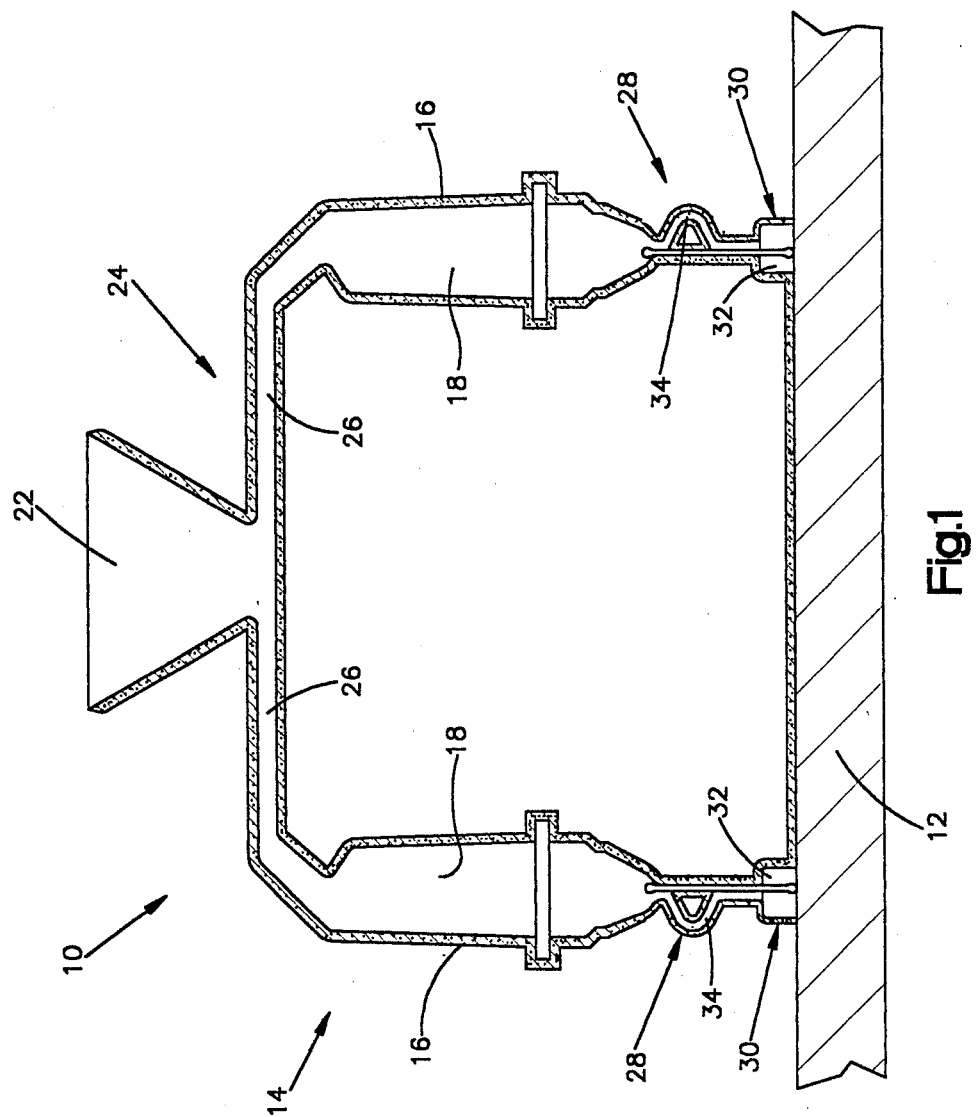
FIG. 1 is a schematic illustration depicting the manner in which a mold constructed in accordance with the present invention is supported on a chill plate prior to pouring of molten metal into the mold.

A mold 10 constructed in accordance with the present invention is illustrated in FIG. 1 on a chill plate 12. The mold 10 includes an annular array 14 of article molds 16. The article molds 16 have mold cavities 18 with configurations corresponding to the configuration of single crystal articles to be cast in the mold structure 10. It should be understood that although only a pair of article molds 16 have been illustrated in FIG. 1, the mold structure 10 includes additional article molds which have not been illustrated but which each have the same construction as the illustrated article molds.

Molten metal is conducted from a pour cup 22 to the article mold cavities 18 through a gating system 24. The gating system 24 includes a plurality of passages or runners 26 which extend outwardly from the bottom of the pour cup 22 to the upper end portions of the article mold cavities 18. The molten metal flows downwardly through the article mold cavities 18 and through a single crystal selector 28 to a starter 30.

The starter 30 includes a generally cylindrical starter cavity 32 having an open lower end which is blocked by the chill plate 12. The molten metal solidifies in the starter cavity 32 as a plurality of elongated grains or crystals which extend upwardly from the chill plate 12 to the upper end of the starter cavity. A few of the grains of metal grow from the starter cavity 32 into a crystal selector passage 34 in the single crystal selector 28.

As the few grains which enter the crystal selector passage 34 continue to grow, the most favorably oriented grain or crystal grows at a greater rate than the other grains or crystals. Therefore, the most favorably oriented grain or crystal crowds out the less favorably oriented grains. This results in the single grain or crystal which is most favorably oriented growing from the crystal selector passage 34 into the article mold cavity 18.

The single grain or crystal which emerges from the crystal selector passage 34 into the article mold cavity 18 solidifies to completely fill the article mold cavity. The single crystal of metal which solidifies in the article mold cavity 18 has a configuration which corresponds to a desired configuration of the article to be cast. The molten metal in the gating system 24 then solidifies. During solidification of the molten metal in the gating system, additional crystals may nucleate.

The one-piece mold structure 10 is formed of a ceramic material by what is frequently referred to as the lost wax process. In making the mold structure 10, a disposable pattern is first formed. The disposable pattern has the same configuration as the interior of the mold structure 10. Thus, main portions of the disposable pattern have a configuration corresponding to the configuration of the article mold cavity 18. Other portions of the disposable pattern have configurations corresponding to the configuration of the starter cavity 32, the selector passage 34 and the gating system 24.

The specific configuration of the disposable pattern will depend upon the configuration of the article to be cast and the gating associated with the article. The disposable pattern may be formed of a natural or artificial wax, polystyrene or other material.

A wet coating of ceramic mold material is applied over the disposable pattern. The wet coating of ceramic mold material may be applied over the pattern by dipping, brushing, spraying or other methods. However, it is presently preferred to repetitively dip the pattern in a liquid slurry of ceramic mold material. Although many different types of slurry could be utilized, one illustrative slurry contains fused silica, zircon, or other refractory materials in combination with binders. A chemical binder such as ethyl silicate, sodium silicate and colloidal silica can be used. In addition, the slurry may contain suitable film formers, such as alginates, to control viscosity and wetting agents to control flow characteristics and pattern wettability.

In accordance with common practices, the initial slurry coating applied to the pattern may contain a very finely divided refractory material to produce an accurate surface finish. A typical slurry for a first coat may contain colloidal silica sol as the binder. Zircon or alumina of a particle size of 325 mesh or smaller as the refractory can be employed, together with less than one-tenth percent by weight of a wetting agent. After the application of the initial coating, the surface is stuccoed with refractory materials having particle sizes on the order of 60 to 200 mesh.

In accordance with well known procedures, each dip coating is dried in air at a temperature of approximately 24° C. before subsequent dipping. The pattern is repetitively dipped and dried enough times to build up a covering of a ceramic mold material of a desired thickness. For example, the pattern may be dipped fifteen times to build up a covering of a thickness of approximately 0.400 inches in order to prevent mold bulge.

The wax material of the pattern is then melted and removed from the mold. After dewaxing, the uncured mold structure is fired in an oxidizing atmosphere at a temperature of more than 540° C. for one hour to thoroughly cure the mold sections, burn any residual pattern material, and drive off any water. It is contemplated that the uncured mold sections may be fired in an oxidizing atmosphere at a temperature of approximately 1,038° C. for approximately one hour. Of course, the specific composition of the slurry of ceramic mold material, number of dip coatings, and firing temperature and time may vary depending upon the construction of the mold.

Single Crystal Selector

In accordance with a feature of the present invention, the crystal selector 28 has a simple construction to minimize the cost of casting single crystal articles, such as airfoils or turbine blades. During the casting of one particular group of single crystal articles, it was determined that when a single crystal selector having a construction corresponding to the construction of the single crystal selector 28 was used, only a single crystal of metal entered the article mold cavity of more than 97 percent of the cavities where the crystal selector was used. Of course, if more than one crystal entered the article mold cavity 18 from the single crystal selector 34, the resulting cast article would be unsatisfactory and would have to be scrapped.

Tooling or injection molds for the making of wax patterns corresponding to the passage 34 in the single crystal selector 28 is substantially less than the cost of tooling for making patterns for known helical selectors. This is because the passage 34 of the single crystal selector 28 has a relatively simple configuration compared to the configuration of the helical passages of known selectors. The selector 28 promotes double orientation of a single crystal casting. Thus, a high percentage of the single crystal castings made with the selector 28 will have a preselected crystallographic orientation in both the vertical and horizontal directions.

The single crystal selector 28 has a one-piece ceramic wall, generally designated with the numeral 38 in FIG. 2, which is integrally formed with the starter 30 and article mold 16. The wall 38 is formed in the manner previously explained by covering a disposable crystal selector pattern with ceramic mold material.

The crystal selector 28 includes a lower section 40 which extends upwardly from the starter 30. The crystal selector 28 has a single bend section 42 which extends sidewardly and upwardly, first away from and then back toward a vertical axis 44 of the lower section 40. An upper section 48 extends upwardly from the single bend section 42. The upper section 48 is vertically aligned with the lower section 40 and is connected with the article mold wall 16. The upper section 48 has a vertical axis 50 which is coincident with the vertical axis 44 of the lower section 40.

A support element 54 extends straight upwardly from the lower section 40 to the upper section 48. The vertical support element 54 spans the space between opposite ends of the single bend section 42 to support the single bend section against the influence of vertical and/or sideward loading. The support element 54 is a cylindrical quartz rod. The cylindrical surface of the linear fused quartz rod has been roughened to promote adherence of the ceramic mold material to the quartz rod. In addition, beads or bulges are formed at opposite ends of the support element 54 to promote the adherence of wax pattern material to the support element during forming of the mold 10. If desired, the support element 54 could be made of a material other than fused quartz, for example, a suitable ceramic material.

The crystal selector passage 34 includes a linear, generally cylindrical, lower portion 58 with a vertical central axis 44. A lower end of the portion 58 of the selector passage 34 opens into the top of the starter cavity 32 at a location on the vertical central axis of the cylindrical starter cavity. The opposite or upper end of the straight lower portion 58 of the selector passage 34 opens into a single bend portion 62 of the selector passage.

Although a majority of the surface area of the vertical lower portion 58 of the selector passage 34 is formed by ceramic mold material, a vertical segment of the side surface of the support element 54 is exposed to the interior of the lower portion of the selector passage. Therefore, the surface of support element 54 forms a vertically extending part of the side wall of the lower portion of the selector passage. The support element 54 has a vertical central axis 66 which extends parallel to and is offset to one side of the central axis 44 of the lower portion 58 of the selector passage 34. The support element 54 has a circular cross section with the same diameter as a circular cross section of the lower portion 58 of the selector passage 34.

The single bend portion 62 of the selector passage 34 has a lower end which opens into the top of the lower portion 58 of the selector passage and an upper end which opens into an upper portion 70 of the selector passage 34. The single bend portion 62 of the selector passage 34 has an upwardly and outwardly inclined entrance ramp 74 which extends from the lower portion 58 of the selector passage to a single arcuate bend 76. The entrance ramp 74 is straight and is disposed in a plane containing the vertical central axis 44 of the lower portion 58 of the selector passage and the vertical central axis 66 of the support rod 54.

The single arcuate bend 76 of the selector passage 34 is formed as a portion of a circle and connects the entrance ramp 74 with a linear exit ramp 78. The arcuately curving central axis of the single bend 76 of the selector passage 34 is disposed in the same flat plane as the central axis of the entrance ramp 74, the central axis 44 of the lower section 40 and the central axis 66 of the support rod 54. The single arcuate bend 76 has a circular cross sectional configuration (FIG. 3) of the same diameter as the circular cross section of the entrance ramp 74. However, if desired, the diameter of the selector passage 34 can vary along its entire length.

The upwardly and inwardly inclined exit ramp 78 (FIG. 2) of the selector passage 34 has a lower end which is connected with the single arcuate bend 76 of the selector passage. An upper end of the straight exit ramp 78 of the selector passage 34 is connected with the upper end portion 70 of the selector passage. The exit ramp 78 of the selector passage 34 has a central axis which is disposed in the same flat plane as the central axes of the single bend 76, entrance ramp 74 and lower portion 58 of the selector passage. The exit ramp 78 of the selector passage 34 has a circular cross sectional configuration of the same diameter as the circular cross section of the arcuate bend 76.

The linear upper portion 70 of the selector passage 34 has a lower end which opens into the exit ramp 78 of the selector passage 34. A circular opening at an upper end of the upper portion 70 of the selector passage 34 opens into the article mold cavity 18. The vertical central axis 50 of the upper portion 70 of the selector passage 34 is disposed in the same flat plane as the central axes of the exit ramp 78, single arcuate bend 76, entrance ramp 74, and lower portion 58 of the selector passage 34. Since the vertical central axis 50 of the upper portion 70 of the selector passage 34 is coincident with the vertical axis 44 of the lower portion 58 of the selector passage, the axis 50 of the upper portion 70 of the selector passage extends parallel to and is offset to one side of the central axis 66 of the support element 54.

Although a majority of the surface area of the vertical upper portion 70 of the selector passage 34 is formed by ceramic mold material, a vertical segment of the side surface of the support element 54 is exposed to the interior of the upper portion of the selector passage. Therefore, the surface of the support element 54 forms a vertically extending part of the side wall of the upper portion of the selector passage. The vertical central axis 76 of the support element 54 extends parallel to and is offset to one side of the central axis 50 of the upper portion 70 of the selector passage 34. The support element 54 has a circular cross section with the same diameter as the circular cross section of the upper portion 70 of the selector passage 58. However, the diameter of the support element 54 could be different than the diameter of the selector passage.

Although the support element 54 is exposed to the interiors of the upper and lower portions 70 and 58 of the selector passage 38, the portion of the support element 54 disposed between opposite ends of the single bend portion 62 of the selector passage 34 is completely enclosed by the ceramic mold material. This enables the support element 54 to strengthen the single bend section 42 of the selector 28 against the influence of vertical and/or sideward loads.

The simplicity of construction of the selector passage 34 is promoted by the fact that the single arcuate bend 76 of the selector passage 34 has a central axis which is disposed in the same flat plane as the central axes 44 and 50 of the lower portion 58 and upper portion 70 of the selector passage. In addition, the selector passage 34 has the same circular cross sectional configuration throughout its length. This simplifies tooling for the formation of a mold into which wax pattern material is injected during the forming of the single crystal selector 28.

The selector passage 34 has a substantially uniform circular cross sectional configuration throughout its length with a diameter of less than 0.25 inches. The single arcuate bend 76 is offset from the central axes 44 and 50 of the lower and upper vertical portions 58 and 70 of the selector passage by a distance which is at least 1.5 times the diameter of the single arcuate bend 76 of the selector passage. Thus, the maximum horizontal distance from the center line of the single arcuate bend 76 to the line of the coincident vertical axes 44 and 50 is at least 1.5 times the diameter of the arcuate bend 76 of the selector passage.

In the illustrated embodiment of the invention, a support element 54 extends downwardly from the crystal selector 28 to the bottom of the starter 30 to enable the support rod 54 to engage the chill plate 12. The opposite end of the support rod 54 extends into the article mold cavity 18. This enables the support rod to transmit force from the article mold 16 directly to the chill plate 12 without applying a load to the single crystal selector 28. However, if desired, the support element 54 could have a lower end portion which is disposed above the starter 30 and an upper end portion which is disposed below the article mold cavity 18.

It is contemplated that certain embodiments of the crystal selector 28 may not require the support rod 54. These embodiments of the crystal selector will be constructed so that both the wax pattern of the selector and the selector itself can withstand normal vertical and/or sideward loads.

Casting Article

When the ceramic mold structure 10 is to be used to cast single crystal articles, such as turbine blades, the chill plate 12 (FIG. 1) is lowered and the mold structure is positioned on the chill plate. The chill plate 12 is then raised to position the mold structure in a cylindrical furnace chamber (not shown). A housing enclosing the furnace chamber is then evacuated to provide a nonoxidizing atmosphere.

After the furnace chamber has been evacuated, the mold structure 10 is preheated to a temperature above the liquidius temperature of the metal to be cast. Although the preheat temperature will vary depending upon the composition of the metal alloy to be cast, it is contemplated that the preheat temperature may be approximately 1,500° C. A flow of molten metal is then conducted into the pour cup 22. The metal flows downwardly through the article mold cavities 18 into the crystal selectors 28. The molten metal may be a nickel chrome super alloy.

After the mold structure 10 has been filled with molten metal, the chill plate 12 is slowly lowered and the mold is withdrawn from the furnace chamber. Molten metal in each of the starter cavities 34 solidifies as a plurality of elongated and vertically upwardly extending grains. As the mold structure 10 is gradually withdrawn from the furnace chamber, a plurality of grains grow from the starter cavity 32 (FIG. 2) upwardly into the lower portion 58 of the selector passage 34. As the molten metal solidifies in the lower portion 58 of the selector passage 34, the grains which are most favorably oriented for vertical growth tend to crowd out the grains which are less favorably oriented.

Continued solidification of the molten metal in the selector passage 34 results in the grains growing into the upwardly and outwardly inclined entrance ramp 74 of the crystal selector passage 34. As the molten metal solidifies along the entrance ramp 74, the grain or grains which are most favorably oriented for sideward growth, that is toward the left (as viewed in FIG. 2), crowd out the less favorably oriented grains. As the molten metal solidifies in the arcuate bend 76 of the selector passage, the most favorably oriented grain will probably crowd out or will have crowded out any other grain or grains.

As the solidification of the molten metal continues from the arcuate bend 76 of the selector passage 34 and to the upwardly and rightwardly (as viewed in FIG. 2) sloping exit ramp 78 of the selector passage, the single most favorably oriented grain will probably solidify as a single crystal in the exit ramp of the selector passage. However, if there should be an additional grain, it will be crowded out by the most favorably oriented grain as the molten metal in the exit ramp 78 of the selector passage solidifies.

Finally, the molten metal in the vertical upper portion 70 of the selector passage will solidify. The vertical portion 70 of the selector passage is provided in order to be certain that the most favorably oriented grain has crowded out all other grains. Thus, it is contemplated that the molten metal in the upper portion 70 of the selector passage 34 will solidify as a single crystal. However, if a second grain should grow into the upper portion 70 of the selector passage 34, an additional opportunity is provided for the most favorably oriented grain to crowd out the second or less favorably oriented grain. Therefore, a single crystal will grow from the upper portion 70 of the selector passage 34 into the article mold cavity 18. This single crystal expands in the article mold cavity 18 and solidifies with a configuration which corresponds to the configuration of the article to be cast.

The single crystal of metal grows upwardly in the article mold cavity 18 to the gating system 24. In the gating system 24, there may be spurious nucleation with a few additional crystals so that the single crystal structure of the solidifying molten metal may end at a location past the upper end of the article mold cavity 18, that is in the gating system 24.

Although it is preferred to withdraw the mold structure 10 from the furnace to cause a generally horizontal solidification zone to move upwardly from the lower end portion of the mold structure to the upper end portion of the mold structure, the mold structure could be maintained stationary in the furnace chamber. If this were done, a plurality of separate coils could be used in the manner disclosed in U.S. Pat. Nos. 3,346,039; 3,376,915; and 3,405,220. The electrical energy to the lower coils would be gradually reduced and terminated to cause the horizontal solidification zone to move slowly upwardly through the stationary article mold cavity 18.

In one specific embodiment of the single crystal selector 28, the distance from the lower end of the article mold cavity 18 to the lower end of the starter 30 was 2.15 inches. The starter cavity 32 had a height of 0.5 inches and a diameter of 0.75 inches. The lower portion 58 of the selector passage 34 had a height of 0.65 inches. The entrance and exit ramps 74 and 78 each had a length of 0.4 inches. The single arcuate bend 76 in the selector passage had a center line radius of approximately 0.15 inches.

In this specific embodiment of the invention, the distance between opposite ends of the entrance and exit ramps 74 and 78 of the selector passage 34 was 0.65 inches. The upper section 48 of the selector passage had a vertical height of 0.25, inches. The selector passage 34 had a circular cross section with a diameter of 0.10 inches. The horizontal distance from the central axes 44 and 50 of the upper and lower portions 58 and 70 of the selector passage to the furthermost point on the center line of the single arcuate bend 76 was 0.5 inches.

The foregoing specific dimensions for the selector passage 34 were obtained by measuring a wax pattern for a specific selector. It should be understood that the foregoing dimensions have been set forth merely for purposes of illustration and not for purposes of limiting the invention. It is contemplated that the dimensions of single crystal selectors constructed in accordance with the present invention will have dimensions which are different than these specific dimensions.

The crystal selector for which the dimensions have been set forth above had a support rod or element 54 with a diameter of 0.1 inches. The support element had an overall length of 2.4 inches.

It should be understood that the foregoing dimensions of the support element, like the other dimensions of the selector, have been set forth for purposes of clarity of illustration and it is not intended that the invention be limited to any particular dimensions. In fact, it is contemplated that the support element 54 could be omitted if desired. Thus, if the selector and its wax pattern are capable of withstanding the vertical and/or sideward loading to which they are subjected, the support element could be eliminated. However, it is preferred to use the support element in order to stabilize the selector and the wax pattern for the selector and to minimize breakage and/or deformation of the selector and/or wax pattern of the selector during handling, the forming of the mold structure 10, and the casting of an article.

Single Crystal Selector—Second Embodiment

Figure 4:
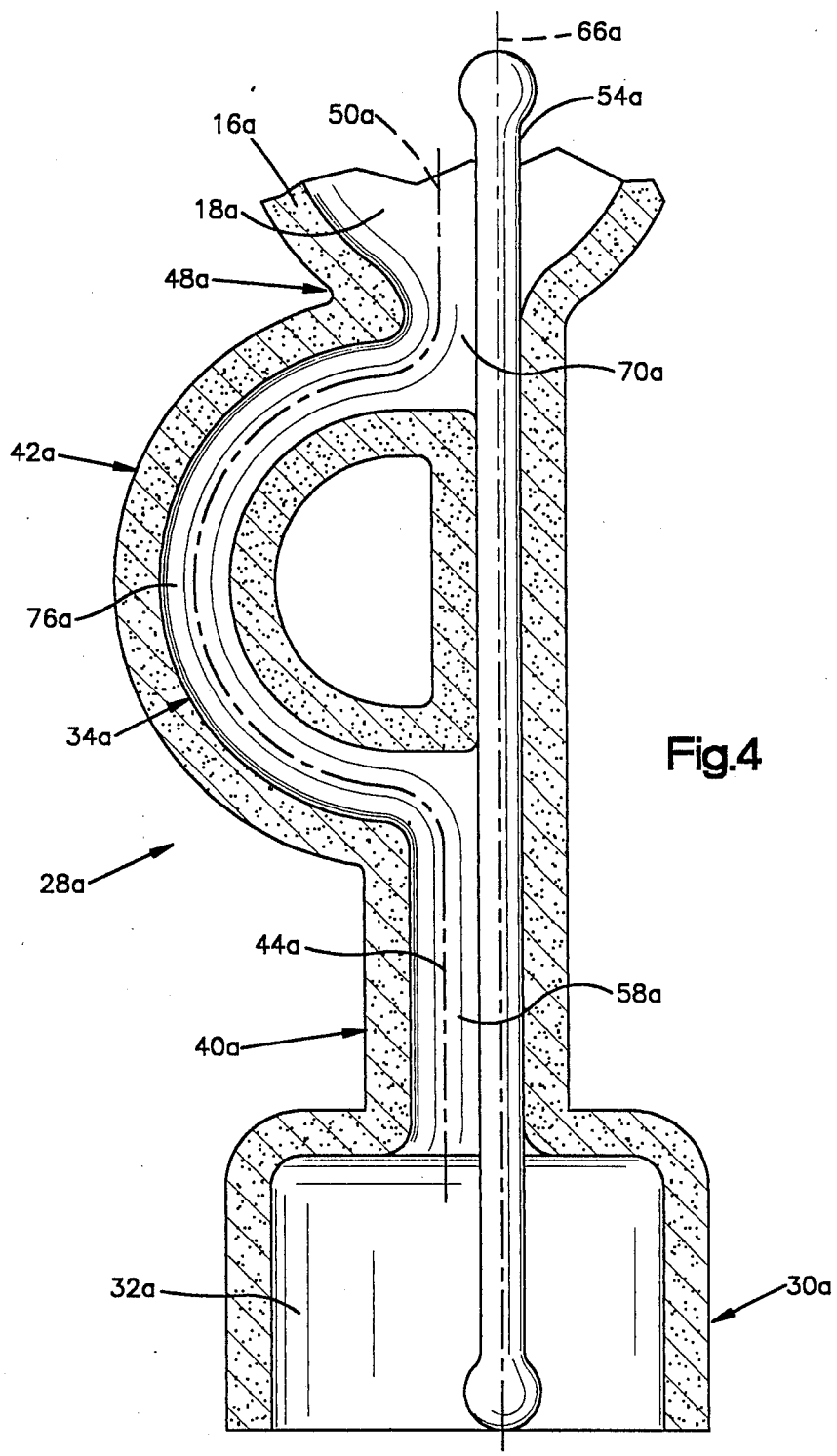
FIG. 4 is an enlarged sectional view, generally similar to FIG. 2, of a second embodiment of the single crystal selector.

In the embodiment of the invention illustrated in FIGS. 1-3, the single crystal selector 28 has a selector passage 34 with linear entrance and exit ramps 74 and 78 leading to and from a single arcuate bend 62. In the embodiment of the invention illustrated in FIG. 4, the selector passage has a single continuously curving arcuate bend which interconnects lower and upper portions of the selector passage. Since the embodiment of the invention illustrated in FIG. 4 is generally similar to the embodiment of the invention illustrated in FIGS. 1-3, similar numerals will be utilized to designate similar components, the suffix letter "a" being added to the numerals of FIG. 4 to avoid confusion.

The single crystal selector 28a (FIG. 4) has a lower section 40a which extends upwardly from a starter 30a. A single bend section 42a extends sidewardly and upwardly first away from the vertical lower section 40a and then back toward the longitudinal central axis 44a of the lower section 40a. A vertical upper section 48a extends upwardly from the single bend section 42a and is connected to the article mold 16a. The upper section 48a is vertically aligned with the lower section 40a.

A straight cylindrical support element 54a extends upwardly from the lower section 40a to the upper section 48a. The support element 54a spans the space between opposite ends of the single bend section 42a of the selector 28a. The support element 54a is a cylindrical fused quartz rod and has an outer side surface which has been roughened to facilitate the adherence of ceramic mold material to the surface of the support element. The rod also has beads on both ends for added adherence.

A selector passage 34a is disposed within the single crystal selector 28a and interconnects the starter cavity 32a and article mold cavity 18a. The crystal selector passage 34a includes a linear vertical, lower portion 58a. The cylindrical lower portion 58a of the selector passage 34a has a lower end which opens into the top of the starter cavity 32a and an upper end which opens into a continuously curving bend 76a of the selector passage 34a. A relatively small percentage of the surface area of the lower portion 58a of the selector passage 34a is formed by the outer side surface of the support element 54a. The vertical axis 44a of the lower portion 58a of the selector passage 34a is parallel to and offset to one side of the vertical central axis 66a of the support element 54a.

The single bend 76a of the selector passage 34a continuously curves from a lower end portion which is connected with the lower portion 58a of the selector passage 34a to an upper end portion which is connected with the upper portion 70a of the selector passage. The continuously curving configuration of the single bend portions 76a results in the single bend portion having a generally "C" shaped configuration. Thus, the arcuate bend portion 76a of the selector passage 34a has a generally semicircular configuration.

The cylindrical upper portion 70a has a lower end which opens to the upper end of the continuous arcuate bend 76a and an upper end which opens to the article mold cavity 18a. A relatively small vertical segment of the surface area of the upper portion 70a of the selector passage 34a is formed by the outer side surfaces of the support element 54a. The vertical axis 50a of the upper portion 70a is coincident with the vertical axis 44a of the lower portion 58a of the passage 34a.

The central axis of the continuously curving single bend 76a of the crystal selector passage 34a is disposed in the same plane as the coincident vertical axes 44a and 50a of the lower and upper portions 58a and 70a of the selector passage. The vertical axis 66a of the support element 54a is disposed in the same plane as the central axes of the lower portion 58a, continuous bend 76a and upper portion 70a of the selector passage 34a.

The selector passage 34a has a circular configuration throughout its length with a diameter of less than 0.25 inches. The distance, measured on a horizontal plane, from the coincident vertical axes 44a and 50a of the lower and upper portions 58a and 70a of the selector passage 34a to the furthermost point on the central axis of the continuously curving bend 76a of the selector passage, that is as measured on the horizontal plane extending through the center of curvature of the continuously curving bend 76a, is at least 1.5 times the cross sectional diameter of the selector passage 34a.

During casting of molten metal in the mold structure of which the selector 28a is a part, the molten metal solidifies in the same manner as previously described in connection with the embodiment of the invention shown in FIGS. 1-3. Thus, a plurality of elongated upwardly extending crystals initially solidify in the cylindrical starter cavity 32a. A few of these crystals grow upwardly into the lower portion 58a of the selector passage 34a. As the crystals grow upwardly in the lower portion 58a of the selector passage 34a, the most favorably oriented crystals tend to crowd the less favorably oriented crystals. The molten metal then solidifies upwardly along the continuously curving bend 76a of the selector passage 34a. As this occurs, the crystal which is most favorably oriented for upward and sideward growth crowds the other crystals. Therefore, only one crystal emerges from the upper portion 70a of the selector passage 34a and grows into the article mold cavity 18a.

The dimensions of the single crystal selector 28a may be generally the same as the dimensions of the single crystal selector 28 of FIG. 3. In this specific embodiment, the single crystal selector 28a would have an overall height of 2.15 inches. The selector passage 34a would have a cross sectional diameter of 0.10 inches. The distance from the line of coincident vertical axes 44a and 50a of the lower and upper portions 58a and 70a of the selector passage 34a to the outermost point on the central axis of the continuously curving single bend portion 76a of the selector passage would be 0.5 inches. Of course, the dimensions of different embodiments of the crystal selector 28a could be different than the foregoing dimensions. For example, one specific embodiment of the selector 28a has an overall height of 2.7 inches.

Conclusion

In view of the foregoing description, it is apparent that the present invention provides a new and improved article mold structure 10 which is used in the casting of single crystal metal articles. The mold structure 10 has an improved crystal selector 28 which promotes the emergence of a single crystal from the selector into an article mold cavity 18. The selector 28 has a relatively simple construction which tends to minimize tooling costs. In addition, the simple construction of the single crystal selector 28 of the present invention minimizes the amount of relatively expensive metal which is used in the selector.

The single crystal selector 28 of the present invention has a selector passageway 34 with a linear lower vertical portion 58 which extends upwardly from a starter cavity 32. The selector passage 34 also has a linear vertical upper portion 70 which extends downwardly from the article mold cavity 18. A single bend portion 62 of the selector passage 34 extends between an upper end of the lower portion 58 of the selector passage and a lower end of an upper portion 70 of the selector passage.

The single bend portion 62 of the selector passage has only a single arcuate bend with a curving longitudinal central axis which is disposed in the same plane as coincident vertical axes 44 and 50 of the lower and upper portions 58 and 70 of the selector passage. The single arcuate bend portion 62 of the selector passage has a diameter which is less than 0.25 inches. The bend portion 62 of the selector passage 34 extends sidewardly from the vertical axes of the upper and lower portions of the selector passage by a distance which is at least 1.5 times the diameter of the single bend portion 62 of the selector passage.

Due to its configuration, the single bend portion 62 of a single crystal selector 28 constructed in accordance with the present invention may have difficulty in withstanding vertical and/or sideward loads applied to a wax pattern of the selector passage and/or ceramic mold material forming the selector. Therefore, a support element 54 may be provided between opposite ends of the single bend portion 62 of the selector 28 to strengthen the selector.

Having described preferred specific embodiments of the invention, the following is claimed:

1. A mold for use in casting a single crystal metal article, said mold comprising article mold means for defining an article mold cavity having a configuration corresponding to the configuration of the article to be cast, starter means for defining a starter cavity in which molten metal solidifies as a plurality of upwardly extending elongated metal crystals, and selector means extending between an upper end portion of said starter means and a lower end portion of said article mold means for at least partially defining a crystal selector passage which extends between said starter cavity and said article mold cavity and from which a single crystal of metal solidifies upwardly into said article mold cavity, said selector means including a lower section connected with said starter means and in which a linear lower vertical portion of said selector passage extends upwardly away from an upper end portion of said starter cavity, an upper section connected with said article mold means and in which a linear upper vertical portion of said selector passage extends downwardly away from a lower end portion of said article mold cavity, a single bend section connected with said upper and lower sections and in which a single bend portion of said selector passage extends between an upper end of the lower portion of said selector passage and a lower end of the, upper portion of said selector passage, and a support element which extends upwardly from said lower section to said upper section of said selector means to at least partially support said bend section of said selector means, said single bend portion of said selector passage having a single arcuate bend and a longitudinal central axis which intersects coincident vertical central axes of said upper and lower portions of said selector passage, said longitudinal central axis of said single bend portion of said selector passage and the vertical central axes of said upper and lower portions of said selector passage being disposed in a single flat plane.

2. A mold as set forth in claim 1 wherein the horizontal distance between the vertical central axes of said upper and lower portions of said selector passage and a furthest point on the longitudinal central axis of the single arcuate bend in said single bend portion of said selector passage is at least as great as 1.5 times the thickness of the selector passage at the single arcuate bend.

3. A mold as set forth in claim 1 wherein said selector passage has a generally circular cross sectional configuration with a diameter which is less than 0.25 inches.

4. A mold as set forth in claim 1 wherein opposite ends of said single bend portion of said selector passage are vertically spaced apart and said support element spans the space between the opposite ends of said single bend portion of said selector passage.

5. A mold as set forth in claim 1 wherein said support element is a rod having a vertical central axis which is offset to one side of the vertical central axes of said upper and lower portions of said selector passage and is disposed in the same flat plane as the longitudinal central axis of said single bend portion of said selector passage and the vertical central axes of said upper and lower portions of said selector passage.

6. A mold as set forth in claim 1 wherein said support element is disposed adjacent to a side of said upper and lower portions of said selector passage opposite from said single bend portion of said selector passage.

7. A mold as set forth in claim 1 wherein an upper end portion of said support element is engaged by said article mold means and a lower end portion of said support element is engaged by said starter means.

8. A mold for use in casting a single crystal metal article, said mold comprising article mold means for defining an article mold cavity having a configuration corresponding to the configuration of the article to be cast, starter means for defining a starter cavity in which molten metal solidifies as a plurality of upwardly extending elongated metal crystals, and selector means extending between an upper end portion of said starter means and a lower end portion of said article mold means for at least partially defining a crystal selector passage which extends between said starter cavity and said article mold cavity and from which a single crystal of metal solidifies upwardly into said article mold cavity, said selector means including a lower section connected with said starter means and in which a linear lower vertical portion of said selector passage extends upwardly away from an upper end portion of said starter cavity, an upper section connected with said article mold means and in which a linear upper vertical portion of said selector passage extends downwardly away from a lower end portion of said article mold cavity, and a single bend section connected with said upper and lower sections and in which a single bend portion of said selector passage extends between an upper end of the lower portion of said selector passage and a lower end of the upper portion of said selector passage, said single bend portion of said selector passage having a single arcuate bend which is spaced from coincident vertical central axes of said upper and lower portions of said selector passage and a longitudinal central axis which intersects the coincident vertical central axes of said upper and lower portions of said selector passage, said longitudinal central axis of said single bend portion of said selector passage and the coincident vertical central axes of said upper and lower portions of said selector passage being disposed in a single flat plane, said single arcuate bend in said single bend portion of said selector passage having a generally circular cross sectional configuration with a diameter which is less than 0.25 inches, said single arcuate bend in said single bend portion of said selector passage having a midpoint which is disposed on the longitudinal central axis of said single arcuate bend at a location which is disposed substantially midway between opposite ends of said single arcuate bend and which is spaced from the coincident vertical central axes of said upper and lower portions of said selector passage by a distance which is at least 1.5 times the diameter of said selector passage at said single arcuate bend.

9. A mold as set forth in claim 8 wherein said single bend portion of said selector passage includes a first linear portion which slopes upwardly and away from said lower portion of said selector passage and a second linear portion which slopes downwardly and away from said upper portion of said selector passage, said single arcuate bend extending between an upper end of said first linear portion and a lower end of said second linear portion.

10. A mold as set forth in claim 8 wherein said single arcuate bend has a radius of curvature which is greater than the diameter of said selector passage at said single arcuate bend.

11. A mold as set forth in claim 8 wherein said single arcuate bend has a substantially constant rate of curvature and extends from the upper end of said lower portion of said selector passage to the lower end of said upper portion of said selector passage.

* * * * *